United States Patent [19]

Iwata et al.

[11] Patent Number: 5,144,391
[45] Date of Patent: Sep. 1, 1992

[54] SEMICONDUCTOR DEVICE WHICH RELIEVES INTERNAL STRESS AND PREVENTS CRACKING

[75] Inventors: Hiroshi Iwata; Shigeru Noguchi; Satoshi Ishida; Keiichi Sano; Shoichiro Nakayama, all of Osaka, Japan

[73] Assignee: Sanyo Electric Co., Ltd., Osaka, Japan

[21] Appl. No.: 658,386

[22] Filed: Feb. 20, 1991

[30] Foreign Application Priority Data

Feb. 28, 1990 [JP] Japan ................... 2-50563

[51] Int. Cl.$^5$ ............ H01L 45/00; H01L 27/12; H01L 29/78; H01L 29/68
[52] U.S. Cl. .................. 357/23.7; 357/4; 357/23.15; 357/2; 357/23.6
[58] Field of Search .......... 357/23.7, 4, 23.15, 357/54, 23-26, 2

[56] References Cited

U.S. PATENT DOCUMENTS

| | | | |
|---|---|---|---|
| 4,621,277 | 11/1986 | Ito et al. | 357/54 |
| 4,990,977 | 2/1981 | Hack et al. | 357/23.7 |
| 5,005,056 | 4/1991 | Motai et al. | 357/2 |

OTHER PUBLICATIONS

J. Electrochem, Soc: Solid-State Science and Technology, Apr., 1978, pp. 601-608 "Reactive Plasma Deposited Si-N Films for MOS-LSI Passivation".

J. Appl. Phy. 65(10), May 15, 1989, pp. 3951-3957, "Gate Dielectric and Contact Effects in Hydrogenated Amorphous Silicon-Silicon Nitride Thin-Film Transistors".

Primary Examiner—Rolf Hille
Assistant Examiner—Wael Fahmy
Attorney, Agent, or Firm—Darby & Darby

[57] ABSTRACT

A semiconductor device according to the present invention comprises a semiconductor thin film, and first and second insulator films formed in such arrangement that the semiconductor thin film being sandwiched therebetween. First and second graded layers each containing a constitutent element of the semiconductor thin film and impurities and having a content of the impurities decreased in the direction of the semiconductor thin film are interposed between the semiconductor thin film and the respective insulator films, thereby to relax internal stress produced in the junction interfaces of the semiconductor thin film and the insulator films and to prevent cracking from occurring in the junction interfaces.

10 Claims, 5 Drawing Sheets

SEMICONDUCTOR DEVICE WHICH RELIEVES INTERNAL STRESS AND PREVENTS CRACKING

BACKGROUND OF THE INVENTION

1. Field of the Invention

The present invention relates generally to a semiconductor device such as a thin film transistor, and more particularly, to a thin film transistor in which internal stress is relaxed in the interfaces of a semiconductor thin film serving as an active layer and insulator films.

2. Description of the Prior Art

A thin film transistor (hereinafter referred to as TFT) using amorphous, polycrystalline, microcrystalline semiconductors or a semiconductor obtained by mixing these semiconductors in place of a conventional single crystal semiconductor has been developed. The semiconductor materials listed as described above are hereinafter collectively referred to as non-single crystal semiconductors in the present invention.

Of the non-single crystal semiconductors, an amorphous semiconductor material, particularly amorphous silicon (hereinafter abbreviated as a-Si) is frequently used when TFTs are formed in large quantities on a substrate having a large area from the advantages that its characteristics of semiconductor as a transistor are stable and a-Si having a large area can be formed.

Such a TFT also utilizes the advantages that a semiconductor thin film having a large area can be easily formed in the plasma CVD (chemical vapor deposition) method and at the same time, a silicon nitride (hereinafter abbreviated as $SiN_x$) film to be a gate insulator film or a passivation film which constitutes the TFT can be continuously formed by only changing source gases in the same method.

In the above described TFT, $SiN_x$ insulator films for a gate insulator film and a passivation film are provided with a semiconductor thin film serving as an active layer being sandwiched therebetween, as described in an article entitled "Reactive Plasma Deposited Si-N Films for MOS-LSI Passivation", J. Electrochem. Soc. "SOLID-STATE SCIENCE AND TECHNOLOGY", April 1978 and an article entitled "Gate dielectric and contact effects in hydrogenated amorphous silicon-silicon nitride thin-film transistors", J. Appl. Phys., Vol. 65, No. 10, May 15, 1989. Such a TFT has the disadvantage in that internal stress is produced by the difference in material between the semiconductor thin film and the $SiN_x$ insulator films, and cracking occurs in the $SiN_x$ insulator films or the semiconductor thin film by the internal stress in the fabricating processes of the TFT.

SUMMARY OF THE INVENTION

An object of the present invention is to provide a semiconductor device in which internal stress in the interfaces of a semiconductor thin film and insulator films is relaxed and cracking is prevented from occurring.

The present invention provides a semiconductor device comprising a semiconductor thin film, and first and second insulator films provided in such arrangement that the above semiconductor thin film is sandwiched therebetween, which is characterized in that first and second graded layers each containing a constituent element of the above semiconductor thin film and a constituent element of the above insulator films and having a content of the constituent element of the insulator films decreased in the direction of the above semiconductor thin film are interposed between the above semiconductor thin film and the above respective insulator films.

Silicon, gallium arsenide, indium phosphide, cadmium sulfide, silicon germanium or the like is used as the above semiconductor thin film.

Accoriding to the present invention, the graded layers are provided on both surfaces of the semiconductor thin film, so that internal stress produced in the junction interfaces of the semiconductor thin film and the insulator films is relaxed and cracking can be prevented from occurring in the junction interfaces.

Furthermore, the semiconductor device according to the present invention is characterized in that the semiconductor device is a TFT, the above semiconductor thin film is a-Si, the above first insulator film is $SiN_x$, the above second insulator film is a passivation film made of $SiN_x$, and each of the above graded layers is $SiN_x$, the content of nitrogen in each of the above graded layers being reduced in the direction of the above semiconductor thin film.

The thickness d1 of the semiconductor thin film is preferably in the range of 100 Å to 3 μm, and the thickness d2 of each of the insulator films is preferably in the range of 1000 Å to 10 μm. In addition, the number of deposited films constituting each of the graded layers is preferably 8 to 14, and the total thickness of each of the graded layers is preferably 600 to 1100 Å. Furthermore, the X values of nitrogen density in each of the graded layers are gradually decreased from 1.33 to 0 in the direction of the semiconductor thin film.

According to the present invention, the graded layers made of $SiN_x$ are provided on both surfaces of the semiconductor thin film, so that internal stress produced in the junction interfaces of the semiconductor thin film and the insulator films is relaxed and cracking can be prevented from occurring in the junction interfaces.

Additionally, the semiconductor device according to the present invention is characterized in that the semiconductor device is a static RAM, the above semiconductor thin film is polycrystalline silicon (hereinafter abbreviated as polySi), the above first and second insulator films are $SiO_2$, and the above first and second graded layers are $SiO_x$, the content of oxygen in each of the above first and second graded layers being reduced in the direction of the above semiconductor thin film.

According to the present invention, the graded layers made of $SiO_x$ are provided on both surfaces of the semiconductor thin film, so that internal stress produced in the junction interfaces of the semiconductor thin film and the insulator films is relaxed and cracking can be prevented from occurring in the junction interfaces.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description is now made of embodiments of the present invention with reference to the drawings.

Figure 1:
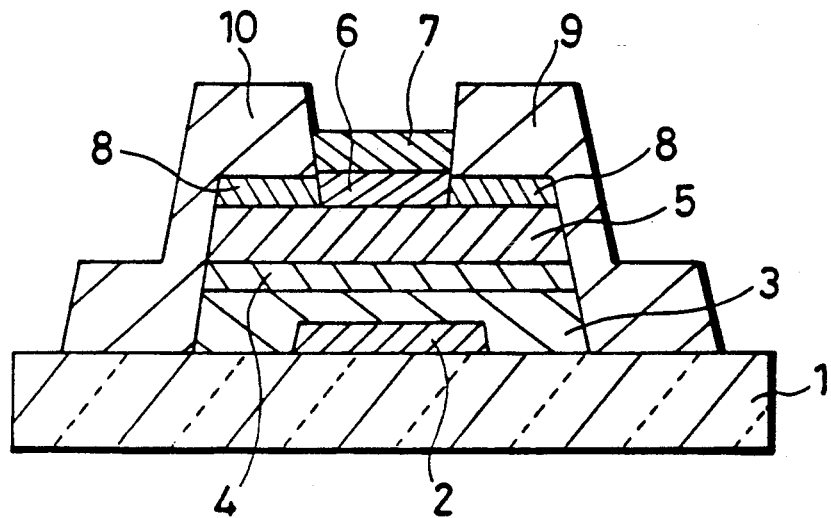
FIG. 1 is a cross sectional view showing an embodiment in which the present invention is applied to a TFT.

An embodiment in which the present invention is applied to a TFT will be first described with reference to FIG. 1. FIG. 1 is a cross sectional view showing a TFT.

As shown in FIG. 1, a gate electrode 2 comprising a thin metal film made of chromium (Cr) or the like and a gate insulator film 3 made of $SiN_x$ are formed on an insulating transparent substrate 1 made of glass or the like. A first graded layer 4 having a nitrogen density sequentially decreased in the direction of the thickness is formed on the gate insulator film 3. A semiconductor thin film 5 made of a-Si or poly-Si is deposited on the first graded layer 4, and a passivation film 7 made of $SiN_x$ is formed thereon through a second graded layer 6 having a nitrogen density sequentially increased in the direction of the thickness.

Furthermore, an impurity doped semiconductor film 8 having impurities for electrical contact, for example, phosphorus (p) doped therein in large quantities is selectively formed on the semiconductor thin film 5, and a drain electrode 9 and a source electrode 10 are respectively formed on the impurity doped semiconductor film 8.

The above first and second graded layers 4 and 6 according to the present embodiment are formed by depositing a lot of $SiN_x$ films each having a thickness of approximately 75 Å. The first graded layer 4 is so set that the nitrogen density of the upper $SiN_x$ film is lower. More specifically, the X values of nitrogen density of the $SiN_x$ films constituting the graded layer 4 are gradually decreased from 1.33 to 0. On the other hand, the second graded layer 6 is so set that the nitrogen density of the upper $SiN_x$ film is higher. More specifically, the X values of nitrogen density of the $SiN_x$ films constituting the graded layer 6 are gradually increased from 0 to 1.33, contrary to the above described graded layer 4.

The number of the deposited $SiN_x$ films constituting each of the first and second graded layers 4 and 6 is approximately 8 to 14, which is approximately 600 to 1100 Å in total thickness.

Internal stress in the TFT according to the above described embodiment will be described. First, a device as shown in FIG. 2 is fabricated and its internal stress is measured, to investigate the stress relaxation effect produced by the first graded layer 4 and the second graded layer 6.

Figure 2:
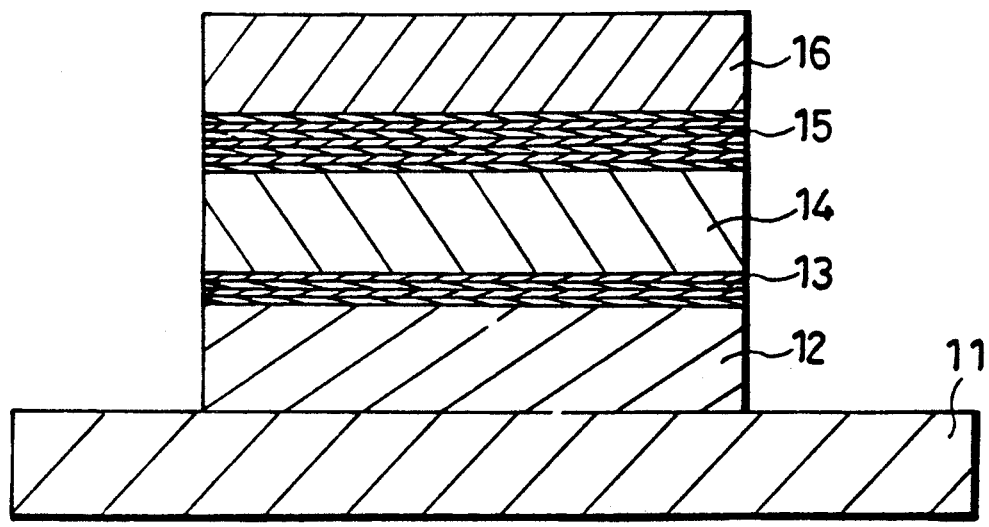
FIG. 2 is a cross sectional view showing a device formed for measuring internal stress in the junction interfaces.

In order to fabricate the device shown in FIG. 2, a $SiN_x$ film is formed on a substrate 11 made of single crystal silicon in the plasma CVD method. Subsequently, a lot of films respectively having X values gradually decreased are deposited as a $SiN_x$ film 13 corresponding to the first graded layer 4 while changing forming conditions in the plasma CVD method.

Thereafter, an a-Si film 14 is deposited similarly in the plasma CVD method, and a lot of films respectively having X values gradually increased, contrary to the above described $SiN_x$ film 13, are deposited thereon as a $SiN_x$ film 15 corresponding to the second graded layer 6.

Thereafter, a $SiN_x$ film 16 is formed in the plasma CVD method.

Warping of a wafer after forming a film is measured by a flat tester, and internal stress ($\sigma$) is measured in accordance with the following equation:

$$\sigma = \frac{Eb^2}{6(1-\gamma)r \cdot d} \text{ (dyn/cm}^2\text{)}$$

E: Young's modulus of single crystal silicon
b: thickness of single crystal silicon
$\gamma$: Poisson's ratio of single crystal silicon
d: thickness of $SiN_x$
r: curvature of single crystal silicon Furthermore, the thicknesses of the above $SiN_x$ films 12 and 16 are set to 3000 Å, and the thicknesses of the $SiN_x$ films 13 and 15 serving as the graded layers are set to 1500 Å. Let N be the number of the deposited films constituting each of the $SiN_x$ films 13 and 15 serving as the graded layers. The results obtained by changing the number of the deposited films from 0 to 20 to measure the change in stress are represented by a curve A in FIG. 3. The composition of the k-th film from the film closest to the a-Si film 14 in each of the $SiN_x$ films 13 and 15 serving as the graded layers is as follows:

$$X = 1.3 \times k/N$$

Figure 3:
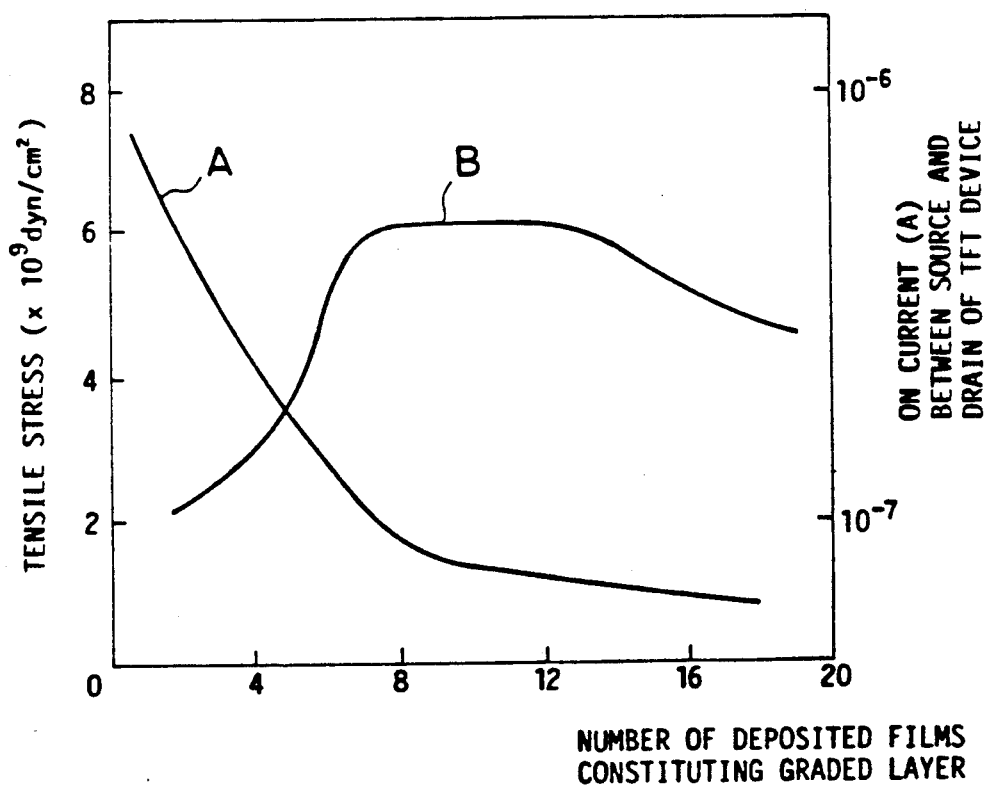
FIG. 3 is a characteristic diagram showing the relation among the number of deposited films constituting each of graded layers, tensile stress and an ON current.

As can be seen from FIG. 3, tensile stress is decreased by increasing the number of the deposited films. Consequently, in order to relax internal stress, it is preferable that the number of the deposited films is larger. The results obtained by changing the number of the deposited films constituting each of the first and second graded layers 4 and 6 in the TFT according to the present invention shown in FIG. 1 to various numbers to measure a source-drain current are then represented by a curve B in FIG. 3.

Meanwhile, the graded layer is obtained by depositing films while sequentially changing their X values of nitrogen density. In FIG. 2, the thickness of each of the films constituting the graded layer is 75 Å.

As represented by the curve B in FIG. 3, an ON current is increased until the number of the deposited films is 8, while being conversely decreased when it exceeds 14. The reason why the ON current is increased until the number of the deposited films is 8 is considered that the trap level in the interface of the semiconductor thin film 5 and the gate insulator film 3 or the graded layer 4 is decreased until it is 8. On the other hand, the reason why the ON current is decreased when the number of the deposited films exceeds 14 is considered that the thickness of the gate insulator film is increased so that an electric field in the interface of the semiconductor thin film 5 and the graded layer 4 is decreased.

Consequently, from the above described results, it is preferable that the number of the deposited films is in the range of 8 to 14, that is, 600 to 1100 Å in thickness.

A method of fabricating the TFT according to the above described embodiment will be described with reference to FIGS. 4A to 4H.

Figure 4A:
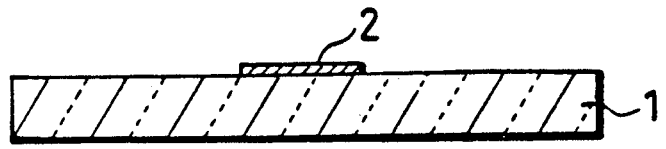
FIGS. 4A to 4H are cross sectional views showing the sequential steps of an example of a method of fabricating the TFT according to the present invention.

First, as shown in FIG. 4A, a thin metal film for a gate is formed on an insulating transparent substrate 1, and this metal thin film is patterned to form a gate electrode 2.

Figure 4B:
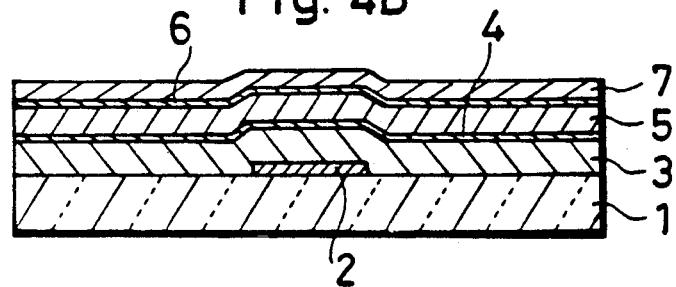

Then, as shown in FIG. 4B, a gate insulator film 3 made of $SiN_x$, a first graded layer 4 having a nitrogen density decreased in the direction of the thickness, and a semiconductor thin film 5 made of a-Si are formed, and a second graded layer 6 having a nitrogen density increased in the direction of the thickness and a passivation film 7 made $SiN_x$ are further formed thereon by sequentially altering source gases in the plasma CVD method.

Figure 4C:
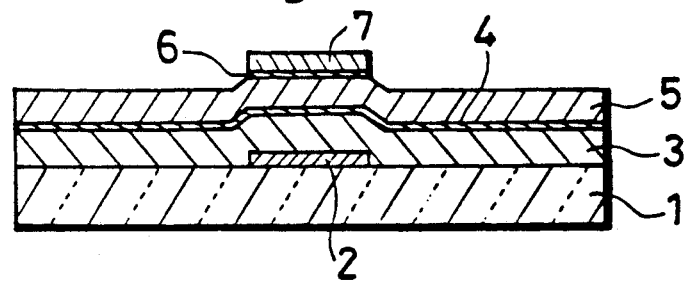

Thereafter, as shown in FIG. 4C, the passivation film 7 and the second graded layer 6 are patterned by etching, leaving the passivation film 7 and the second graded layer 6 only in a channel portion on the gate electrode 2.

Figure 4D:
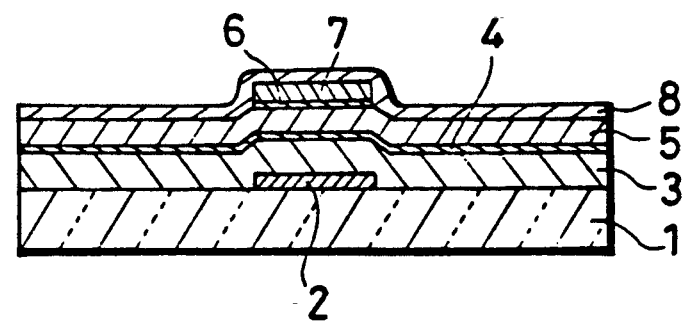
Figure 4E:
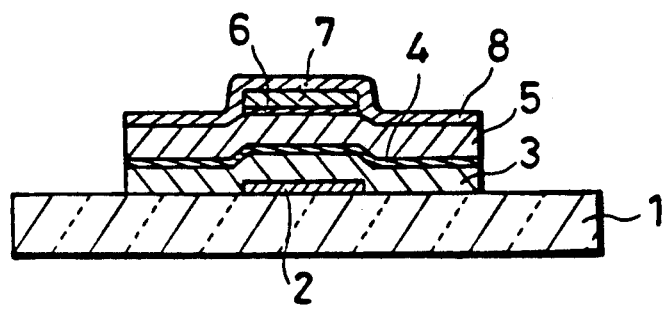

An $n^+$-type impurity doped semiconductor film 8 having phosphorus (P) for electrical contact doped therein in large quantities is formed in the plasma CVD method as shown in FIG. 4D and then, this deposited thin film is patterned with it being left by predetermined amounts on both sides of the channel region to form island regions as shown in FIG. 4E.

Figure 4F:
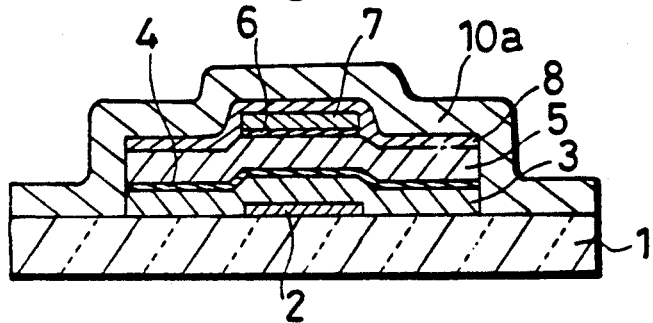
Figure 4G:
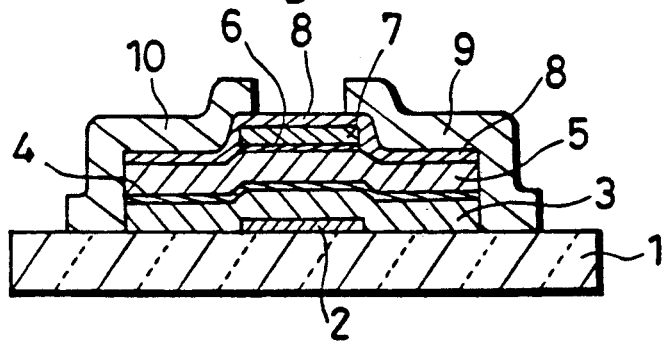

Furthermore, a metal film 10a made of aluminum (Al) or the like is formed on the impurity doped semiconductor film 8 as shown in FIG. 4F and then, the metal film 10 is etched to form a drain electrode 9 and a source electrode 10 as shown in FIG. 4G.

Figure 4H:
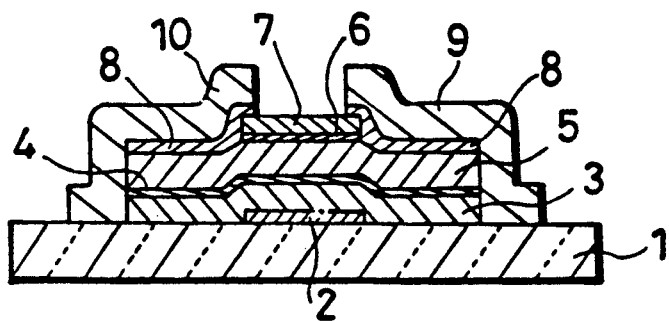

Finally, as shown in FIG. 4H, the impurity doped semiconductor film 8 on the passivation film 7 is removed, thereby to form an inverted staggered type TFT.

Although the graded layers are easily formed in the plasma CVD method, the thermal CVD method or the like, they are formed in the plasma CVD method in the present embodiment.

As typical forming conditions, gases obtained by mixing an ammonia gas ($NH_3$) and a nitrogen gas ($N_2$) with a silane gas ($SiH_4$) which is a silane compound is used, the degree of vacuum at the time of the reaction is set to 0.3 Torr, high-frequency power is set to 200 W, and the temperature of the substrate is set to approximately 300° C.

Particularly, a nitride film whose density is changed can be easily formed by setting the $SiH_4$ gas to 10 sccm and setting the $NH_3$ gas to 40 sccm, for example. In addition, as a method of changing the composition ratio of Si to N in the above nitride film, the flow of $SiH_4$ is made constant and the total flow of $NH_3$ and $N_2$ is gradually decreased with the flow ratio of $NH_3$ to $N_2$ being kept 1:5.

Although in the above described embodiment, the graded layer has a multilayer deposited structure, the content of nitrogen (N) in the graded layer may be continuously changed by continuously changing the flow ratio of $NH_3$ to $N_2$.

Figure 5:
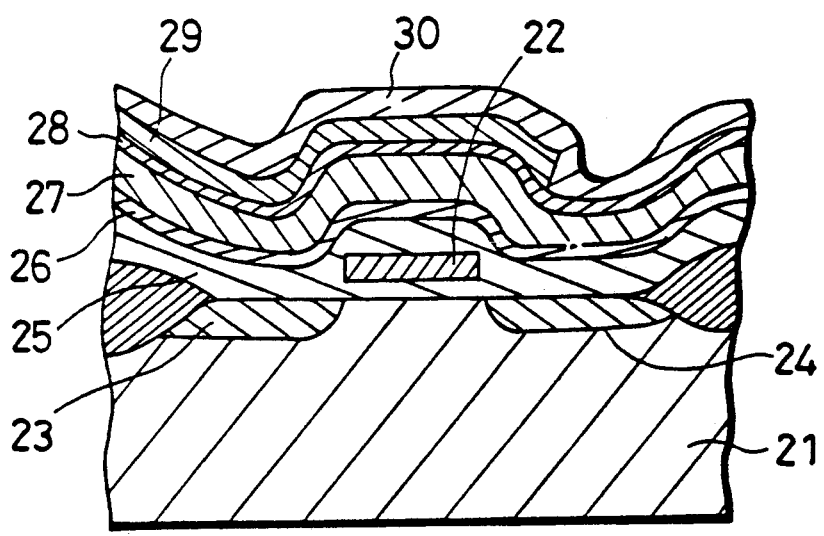
FIG. 5 is a cross sectional view showing an embodiment in which the present invention is applied to a static RAM.

An embodiment in which the present invention is applied to a multilayer structure of a static RAM will be described with reference to FIG. 5. FIG. 5 is a cross sectional view showing a static RAM.

As shown in FIG. 5, a source electrode 23 and a drain electrode 24 are formed on the surface of a $P^+$-type silicon (Si) substrate 21 using a poly-Si gate 22 as a mask by self-alignment, and a $SiO_2$ insulator film 25 is formed so as to surround the poly-Si gate 22.

A first graded layer 26 having an oxygen density sequentially decreased in the direction of the thickness is formed on the insulator film 25, and a poly-Si resistor 27 is formed thereon.

A $SiO_2$ insulator film 29 is formed on the poly-Si resister 27 through a second graded layer 28 having an oxygen density sequentially increased in the direction of the thickness. A line 30 made of Al is formed on the insulator film 29.

The first graded layer 26 is so set that the oxygen density of the upper $SiO_x$ film is lower. More specifically, the X values of oxygen density of $SiO_x$ films constituting the graded layer 27 are gradually decreased. In addition, the second graded layer 28 is so set that the oxygen density of the upper $SiO_x$ film is higher. More specifically, the X values of oxygen density of $SiO_x$ films constituting the graded layer 28 are gradually increased, contrary to the above described first graded layer 26.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for relieving stress and preventing cracking, comprising:
   a semiconductor thin film;
   first and second insulator films provided in such arrangement that said semiconductor thin film is sandwiched therebetween and each contains a constituent element of said semiconductor thin film; and
   means for relieving internal stress and preventing cracking, said relieving and preventing means including first and second multilayered graded layers each having a plurality of respective insulating thin films each containing the constituent element of said semiconductor thin film and a constituent element of said insulator films deposited therein so that a content of the constituent element of the insulator films in said insulating thin films decreases in the direction of said semiconductor thin film, said first and second multilayered graded layers each being interposed between said semiconductor thin film and a respective one of said insulator films.

2. The device as in claim 1, wherein said semiconductor thin film is silicon.

3. The device as in claim 1, wherein the insulating thin films constituting each of said multilayered graded layers comprise a plurality of 8 to 14 insulating thin films, the total thickness of each of said multilayered graded layers being 600 to 1100 Å.

4. The device as in claim 1, wherein said semiconductor device is a thin film transistor.

5. The device as in claim 4, wherein said semiconductor thin film is composed of silicon.

6. The device as in claim 5, wherein said semiconductor device is a thin film transistor, said semiconductor film being amorphous silicon, said first insulator film being $SiN_x$, said second insulator film being a passivation film made of $SiN_x$, said first and second multilayered graded layers each being $SiN_x$, and each of the insulating thin films constituting each of said multilayered graded layers having a content of nitrogen which decreases in the direction of said semiconductor thin film.

7. The device as in claim 6, wherein said semiconductor thin film has a thickness d1 where 100 Å<d1<3μ, each of said insulator films having a thickness d2 where 1000 Å<d2<10μ.

8. The device as in claim 6, wherein the insulating thin films constituting each of said multilayered graded layers comprise a plurality of 8 to 14 insulating thin films, and each of said multilayered graded layers have a total thickness of 600 to 1100 Å.

9. The device as in claim 6, wherein each of the insulating thin films constituting each of said multilayered graded layers have X values of nitrogen density which gradually decrease from 1.33 to 0 in the direction of said semiconductor thin film.

10. The device as in claim 1, wherein said semiconductor device is a static RAM, said semiconductor thin film being polysilicon, said first and second insulator films being $SiO_2$, said first and second multilayered graded layers being $SiO_x$, and each of the insulating thin films constituting each of said first and second multilayered graded layers having a content of oxygen which decreases in the direction of said semiconductor thin film.

* * * * *